United States Patent [19]

Wasa et al.

[11] 3,924,150

[45] Dec. 2, 1975

[54] TURNABLE PHOTOTRANSDUCERS

[75] Inventors: Kiyotaka Wasa, Nara; Fumio Hosomi, Higashiosaka; Shigeru Hayakawa, Hirakota, all of Japan

[73] Assignee: Matsushita Electric Industrial Co., Ltd., Osaka, Japan

[22] Filed: June 20, 1974

[21] Appl. No.: 481,452

Related U.S. Application Data

[63] Continuation of Ser. No. 315,825, Dec. 18, 1972, abandoned.

[30] Foreign Application Priority Data

Dec. 28, 1971 Japan .................................... 47-134
Dec. 28, 1971 Japan .................................... 47-135
June 14, 1972 Japan ................................ 47-59921

[52] U.S. Cl. ................ 307/311; 250/211 J; 357/16; 357/30; 357/46

[51] Int. Cl.$^2$ ........................................ H01L 31/10

[58] Field of Search .................. 250/211 J; 307/311; 357/30, 16

[56] References Cited

UNITED STATES PATENTS

| | | | |
|---|---|---|---|
| 2,991,366 | 7/1961 | Salzberg | 357/30 |
| 3,234,057 | 2/1966 | Anderson | 357/16 |
| 3,424,908 | 1/1969 | Sitter | 250/211 J |
| 3,478,214 | 11/1969 | Dillman | 357/16 |
| 3,508,126 | 4/1970 | Newman et al. | 357/16 |
| 3,693,016 | 9/1972 | Weber | 250/211 J |

OTHER PUBLICATIONS

Kajiyama et al., "Electrical and Optical Properties of $SnO_2$—Si...," Japan J. Appl. Phys., Vol. 6, pp. 905–906, (1967).

Donnelly et al., "Photovoltaic Response of nGe–nSi...," Solid State Electronics, Vol. 9, 1966, pp. 174–178.

*Primary Examiner*—William D. Larkins
*Attorney, Agent, or Firm*—Wenderoth, Lind & Ponack

[57] ABSTRACT

A tunable phototransducer comprises an isotype heterojunction photodiode, a bias voltage source connected in parallel with the isotype heterojunction photodiode, and a rectifying circuit connected to output terminals for the photovoltages of the heterojunction photodiode.

3 Claims, 10 Drawing Figures

TURNABLE PHOTOTRANSDUCERS

This is a continuation of application Ser. No. 315,825, filed Dec. 18, 1972, now abandoned.

BACKGROUND OF THE INVENTION

1. Field of the Invention

This invention relates to a phototransducer, and more particularly to a tunable phototransducer comprising an isotype heterojunction photodiode which can be electrically tuned to the detectable wavelengths of incident light signals.

2. Description of the Prior Art

Multi-channel optical communication systems require high speed phototransducers which can detect incident light signals of different wavelengths and also discriminate among duplex light signals of different wavelengths for use in integrated optoelectronic devices. At present, the phototransducers employed mostly consist of photodiodes which are coated by optical bandpass filters. The phototransducers according to the prior art, however, have disadvantages such as that they are difficult to use in the production of integrated optoelectronic devices and they are difficult to tune to detectable wavelengths at high speed.

SUMMARY OF THE INVENTION

An object of the present invention is to provide a novel tunable phototransducer which can be electrically tuned to the detectable wavelengths of incident light signals.

Another object of the invention is to provide a novel tunable phototransducer which can discriminate among duplex light signals of different wavelengths.

A further object of the invention is to provide a tunable phototransducer which is easily used for making integrated optoelectronic devices.

BRIEF DESCRIPTION OF THE DRAWINGS

Further features and advantages of the invention will appear from the following description and drawing, wherein.

DESCRIPTION OF THE PREFERRED EMBODIMENT

Figure 1:
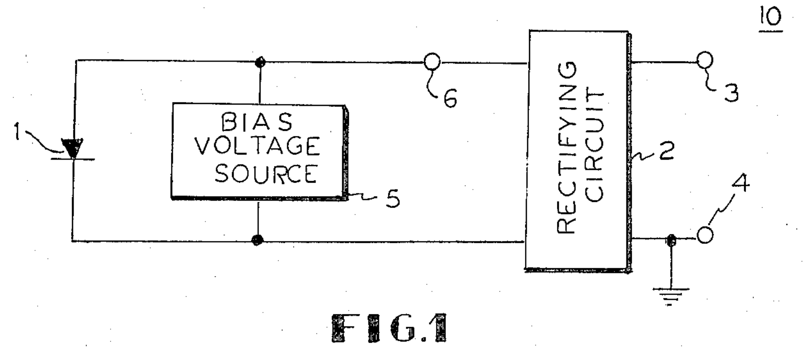
FIG. 1 is a block diagram of a tunable phototransducer in accordance with the present invention.

Referring to FIG. 1, a tunable phototransducer 10 according to the present invention comprises an isotype heterojunction photodiode designated by a reference numeral 1, a rectifying circuit 2 which has an output terminal 3 and a common terminal 4 and is connected to a photovoltage output terminal 6 of isotype heterojunction photodiode 1, and a variable bias voltage source 5 connected in parallel with isotype heterojunction photodiode 1.

Isotype heterojunction photodiode 1 is made of n-n isotype heterojunctions or p-p isotype heterojunctions. These types of isotype heterojunctions will produce a double-depleted junction similar to two metal semiconductor diodes connected back-to-back, and the photoresponse of this type of junction will produce a photovoltage, the sign of which will depend both on the wavelengths of incident light signals and the forward bias voltage across the function.

Figure 2:
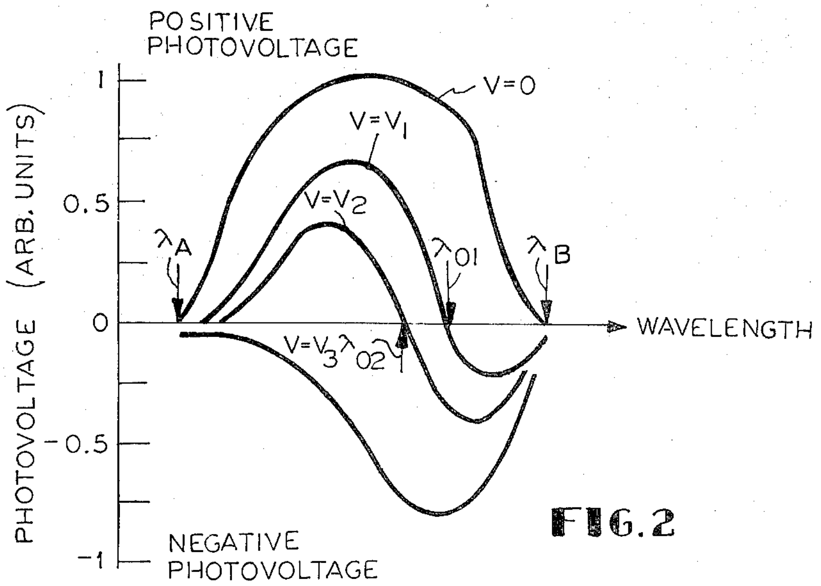
FIG. 2 is a graph illustrating typical photoresponses of an isotype heterojunction photodiode shown in FIG. 1.

FIG. 2 shows typical variations of the photovoltages of the isotype heterojunction photodiode for various wavelengths of incident light for various D.C. bias voltages $V_1$, $V_2$ and $V_3$ ($V_1 < V_2 < V_3$) across the junction. Referring to FIG. 2, the photovoltages are mostly induced between the wavelengths $\lambda_A$ and $\lambda_B$, corresponding to the bandgap energy of each semiconductor comprising the isotype heterojunction. The photovoltage is positive at no bias voltage, $V=0$, and the photovoltages become negative at wavelengths above $\lambda_{02}$ at the bias voltage $V_2$. At the bias voltage $V_3$, the photovoltage becomes completely negative. Since the sign of the photovoltage varies with the bias voltage, and also the bandwidths corresponding to the generation of positive photovoltages or the generation of negative photovoltages vary with the bias voltage, the photodiode can be electrically tuned to detect detectable bandwidths of incident light by changing bias voltages, and the heterojunction photovoltages can be detected through a rectifying circuit 2 as shown in FIG. 1.

Figure 3:
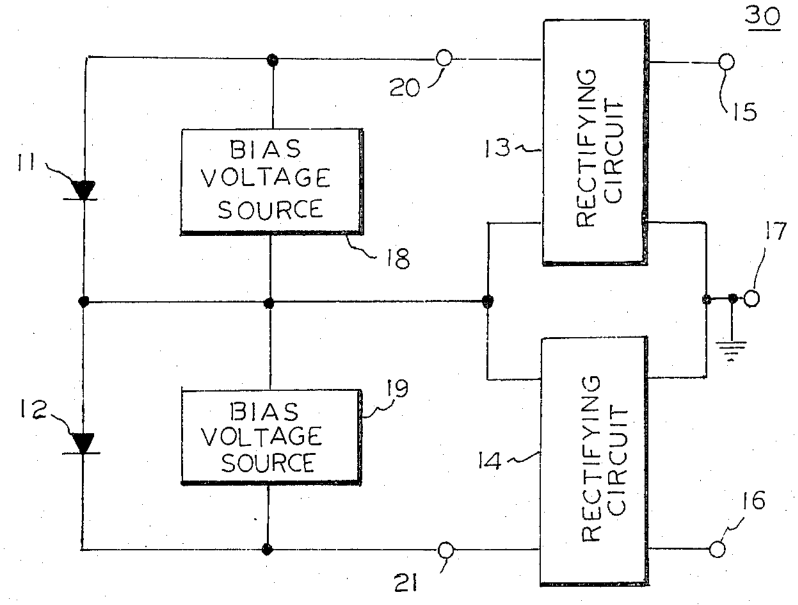
FIG. 3 is a block diagram of another embodiment of a tunable phototransducer in accordance with the present inventions.

FIG. 3 shows another embodiment of tunable phototransducers which can discriminate among duplex light signals of different wavelengths, in accordance with the present invention.

Referring to FIG. 3, a tunable phototransducer 30 comprises paired isotype heterojunction photodiodes 11 and 12, paired rectifying circuits 13 and 14 having output terminals 15 and 16, and a common terminal 17, respectively, and variable DC bias voltage sources 18 and 19 which are connected in parallel with the paired isotype heterojunction photodiodes and connected to photovoltage output terminals 20 and 21, respectively. Paired isotype photodiodes 11 and 12 have the same electroptical properties as each other and the properties are similar to those described in connection with FIG. 2. Rectifying circuits 13 and 14 have opposite rectifying properties from each other, that is, the rectifying circuit 13 has low impedance for positive signals and the rectifying circuit 14 has low impedance for negative signals. Referring again to FIG. 2, positive photovoltages are observed between the wavelengths $\lambda_A$ and $\lambda_{01}$ and negative photovoltages are observed between $\lambda_{01}$ and $\lambda_B$ when the bias voltage on the isotype heterojunction photodiodes is $V_1$. Therefore, when paired isotype heterojunction photodiodes 11 and 12 are equally biased at voltage $V_1$, the electrical signals appearing at terminal 15 indicate that the light signals have wavelengths between $\lambda_A$ and $\lambda_{01}$, corresponding to the positive photovoltages, and the electrical signals at terminal 16 indicate that the light signals have wavelengths between $\lambda_{01}$ and $\lambda_B$, corresponding to the negative photovoltages. Accordingly, duplex light signals having different wavelengths $\lambda_x$ and $\lambda_y$ ($\lambda_A < \lambda_x < \lambda_{01}$, $\lambda_{01} < \lambda_y < \lambda_B$), which are incident upon the paired isotype heterojunction photodiodes, can be converted into separate electrical signals.

It is thought that the invention will be more fully understood from the following examples.

EXAMPLE 1

Figure 4A:
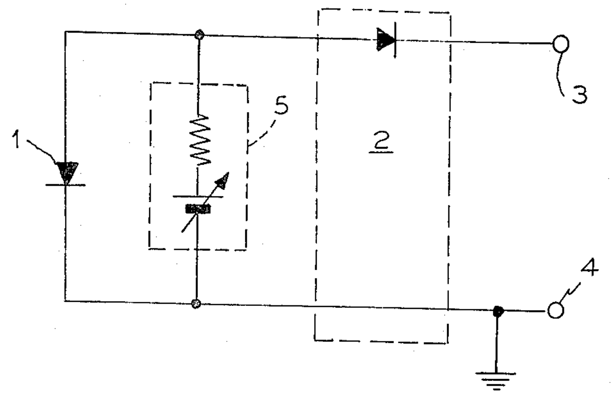
FIGS. 4*a* and 4*b* are circuit diagrams of tunable phototransducer circuits in accordance with the present invention.
Figure 4B:
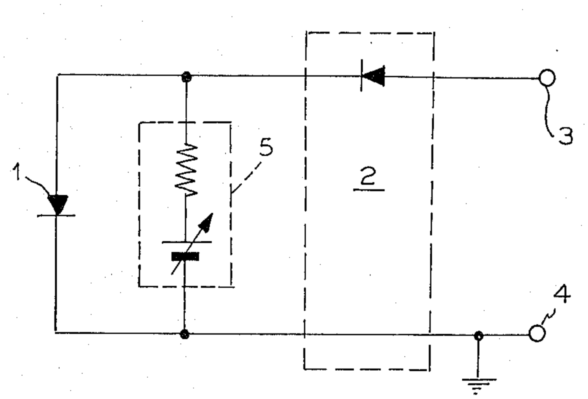

FIGS. 4*a* and 4*b* show a tunable phototransducer circuit in accordance with the present invention. CdSe—Ge n-n isotype heterojunction photodiodes are used for the isotype photodiodes 1. Since larger band gap energy materials are useful for window materials due to the small absorption of incident light energy, CdSe is used as the window material and Ge is used as the base material. A low operating voltage rectifying diode is connected in series with each isotype heterojunction photodiode 1, such as a Ge diode, for a rectifying circuit 2. The bias voltage source 5 comprises a low impedance DC voltage source and a high impedance series resistance such as 1 to 10 MΩ.

Figure 5:
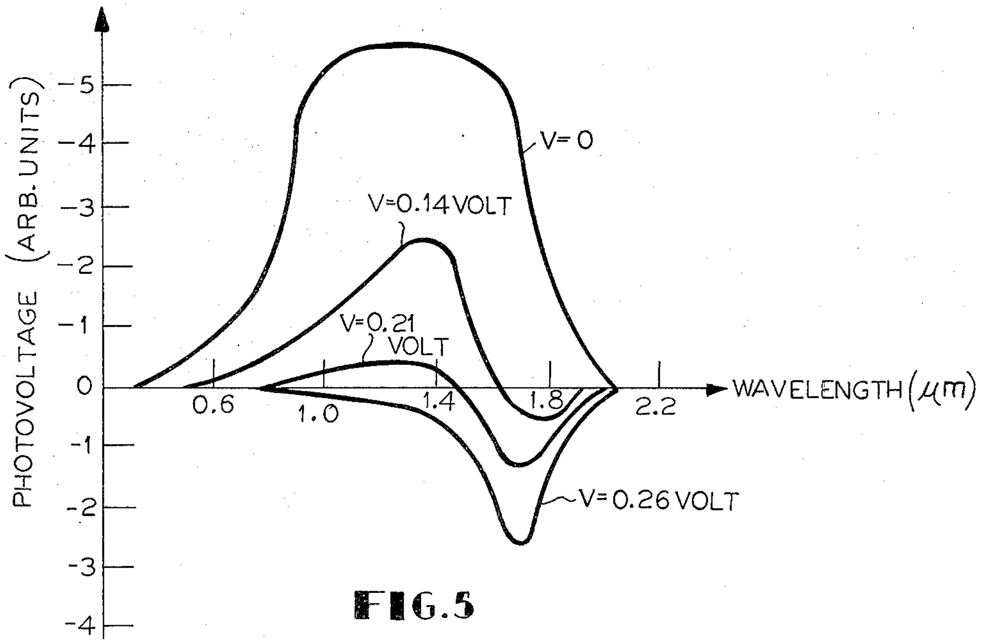
FIG. 5 is a graph illustrating typical photoresponses of CdSe-Ge isotype n-n heterojunction photodiodes shown in FIGS. 4*a* and 4*b*.

When bias voltages of 1.14 to 0.26 volts are applied to isotype photodiodes 1 in a forward direction, i.e., to the CdSe or positive side of the diodes, negative photovoltages are observed, and in a reverse direction, negative photovoltages are scarcely observed. FIG. 5 shows the photoresponse of such a CdSe—Ge isotype heterojunction photodiode. The photovoltage is induced when the light has wavelengths between 0.7 and 1.9 μm, corresponding nearly to the bandgap energy of CdSe and Ge, respectively. The resultant photoresponses of the phototransducers in the circuits of FIGS. 4*a* and 4*b* are shown in FIGS. 6*a* and 6*b*, respectively.

Figure 6A:
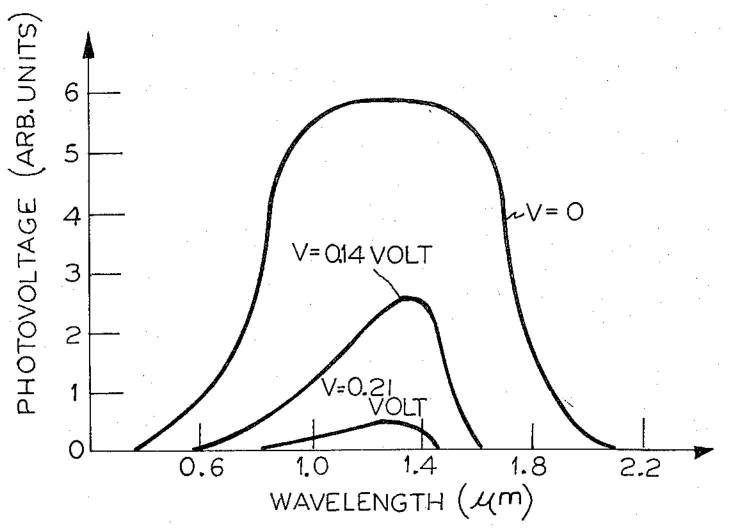
FIGS. 6*a* and 6*b* are graphs illustrating operating characteristics of the tunable phototransducers shown in FIGS. 4*a* and 4*b*, respectively.
Figure 6B:
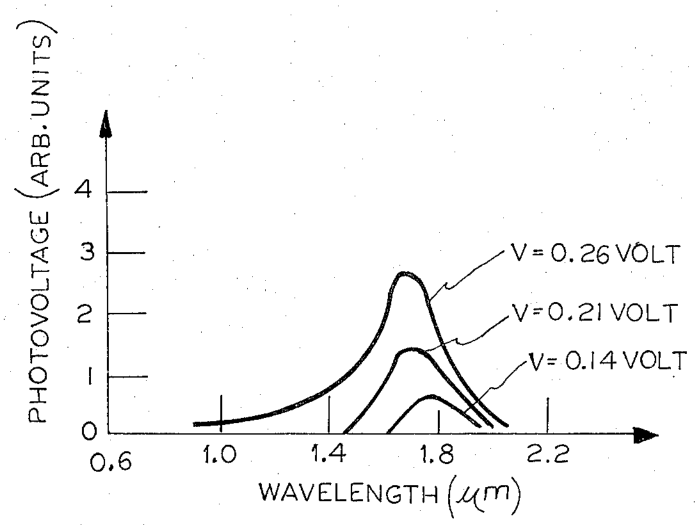

From FIGS. 6*a* and 6*b* it will be seen that it is possible to tune the photodiodes to detectable wavelengths of incident light signals electrically by adjusting the bias voltages. That is, at zero bias, the detectable bandwidth ranges from 0.7 to 1.9 μm, and at 0.14 volt bias, it ranges from 0.7 to 1.5 μm for the phototransducer shown in FIG. 4*a*. In case of the phototransducer shown in FIG. 4*b*, the detectable bandwidth ranges from 0.7 to 1.9 μm at a 0.26 volt bias and from 1.6 to 1.9μm at a 0.14 volt bias.

EXAMPLE 2

Figure 7:
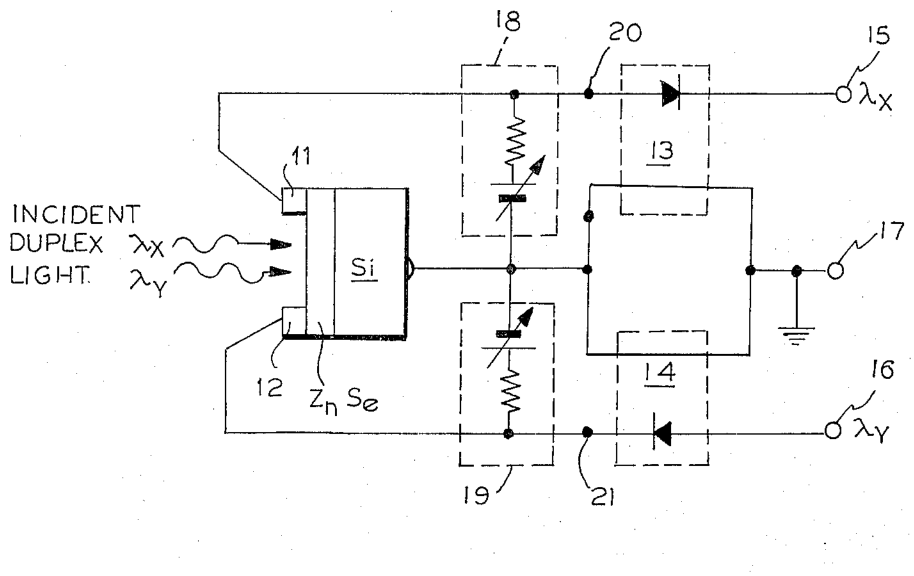
FIG. 7 is a circuit diagram of another tunable phototransducer circuit in accordance with the present invention.
Figure 8:
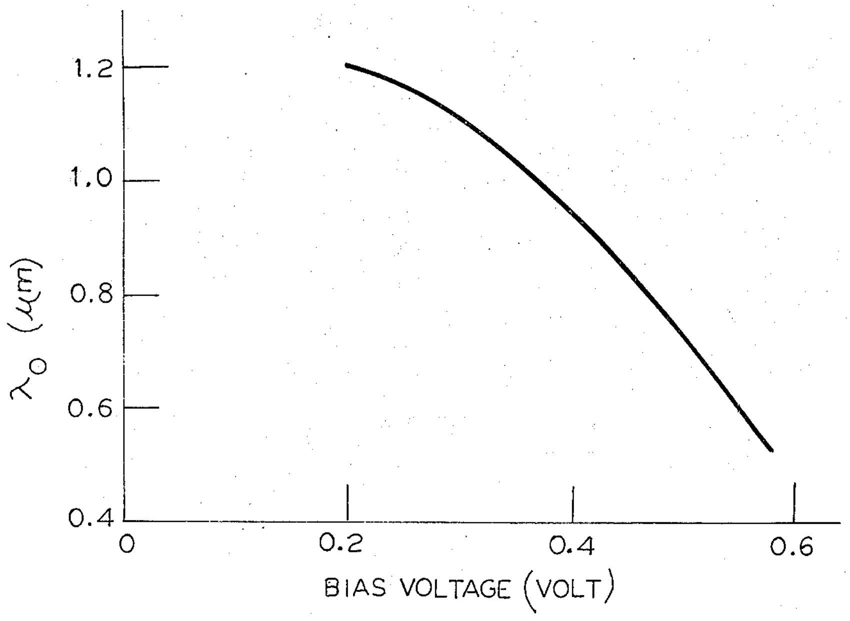
FIG. 8 is a graph illustrating an operating characteristic of a tunable phototransducer shown in FIG. 7.

Paired ZnSE—Si n-n isotype heterojunction photodiodes are used for the isotype heterojunction photodiodes 11 and 12 in a circuit as shown in FIG. 3. ZnSe is used as the window material and Si is used as the base material. FIG. 7 shows the circuit configuration corresponding to the block diagram shown in FIG. 3. The ZnSe—Si isotype heterojunction photodiodes respond to light having wavelengths between 0.45 and 1.2μm and the circuit can be tuned to detectable bandwidths in the range of 0.45 to 1.2μm by adjusting the forward bias voltage to a voltage in the range of 0 to 0.6 volts applied to the ZnSe side, which is the positive side of the diode. The electronic signals appearing at the terminal 15 correspond to light in the bandwidth of 0.45 to $\lambda_0$μm, and the signals at the terminal 16 correspond to light in the bandwidth of $\lambda_0$ to 1.2μm. FIG. 8 shows values of $\lambda_0$ for various bias voltages. Duplex light signals comprising light having different wavelengths $\lambda_x$ and $\lambda_y$ ($0.45 < \lambda_X < \lambda_0\mu m$, $\lambda_0 < \lambda_y < 1.2\mu m$), which are incident upon the paired ZnSe—Si isotype heterojunction photodiodes, can be converted into separate electrical signals at the terminals 15 and 16. The electrical signals at the terminal 15 correspond to the signals of wavelengths $\lambda_x$ and the signals at the terminal 16 correspond to the wavelengths $\lambda_y$. The series resistance in the bias voltage source should not be much less than the resistance of the isotype heterojunction photodiodes in order to induce high photovoltages at the output terminals 20 and 21, and a resistance value of 1 to 10 MΩ is preferable. The operation voltage of the rectifying diode in the forward direction should be much smaller than the photovoltage induced in the isotype heterojunction photodiodes in order to induce high output voltages at the output terminals 15 and 16, and a value of the operating voltage of less than 0.1 volt is preferable.

The n-n ZnSe—Si isotype heterojunction photodiodes are manufactured, for instance, by epitaxial growth of n-type ZnSe layers of about 0.5μm in thickness (resistivity ~$10^3$Ωcm) on the (111) plane of n-type Si single crystal wafers of about 100 μm in thickness (resistivity ~$10^2$Ωcm) by using an r-f sputtering process followed by vacuum evaporation of semi-transparent In low resistance contacts onto the ZnSe and Si. The light is incident upon the surface of the ZnSe.

Any type epitaxial growth method can be used for manufacturing isotype heterojunction photodiode, such as a solution-grown method or a chemical vapor grown method, if the resultant isotype heterojunction photodiodes can have only a double-depleted junction with detectable photovoltages.

As described hereinbefore, the operating bandwidth of the phototransducer according to the present invention will be approximately the bandgap energies of the paired semiconductors comprising the isotype heterojunctions and this bandwidth is approximately between the wavelengths corresponding to the bandgap energies of the paired semiconductors. Therefore, various phototransducers having various operating bandwidths can be manufactured by selecting appropriate combinations of the semiconductors comprising the isotype heterojunctions. Combinations of semiconductors which have large bandgap energies such as n-type $SnO_2$ and n-type ZnSe produce a phototransducer operating in a short wavelength region, i.e., the blue to ultra-violet region. Combinations of semiconductors which have small bandgap energies such as n-type Ge and n-type InSb produce a phototransducer operating in the long wavelength region, i.e., the infrared region. Combinations of a semiconductor which has a large bandgap energy and a semiconductor which has a small bandgap energy such as n-type $SnO_2$ and n-type InSb produce a phototransducer operating in a wide band between the ultra-violet and the infrared region.

Semiconductors which can be used as the phototransducer of the present invention are not restricted to the n-type semiconductors. P-type semiconductors are also usable, and both elemental semiconductors and compound semiconductors are usable. Thus, the isotype heterojunction photodiodes are preferably made of paired n-type semiconductors selected from elemental semiconductors, such as Ge, Si or Te, or compound semiconductors, such as CdSe, ZnSe, ZnO, $SnO_2$, GaAs or InSb, or of paired p-type semiconductors selected from elemental semiconductors, such as Ge, Si or Te, or compound semiconductors, such as CdTe, GaAs or InSb.

The phototransducers according to the present invention can change their response to the detectable bandwidths at high speed when AC bias voltages such as toothed wave voltages are applied to the heterojunction photodiodes. By using such AC bias voltages as toothed voltages and by sampling the electrical output, phototransducers such as that shown in FIG. 1 can detect not only one light signal, but also multi-wave length light signals comprising different wavelengths. For instance, referring again to FIG. 2, when toothed voltages whose minimum and maximum voltages are 0 and $V_2$ volts, respectively, are applied to heterojunction photodiode 1 used in the phototransducer as shown in FIG. 4*a*, and multi-wave length light signals comprising, for instance, the wavelengths of $\lambda_1$, $\lambda_2$ and $\lambda_3$ ($\lambda_3 < \lambda_2 < \lambda_1$, $\lambda_{01} < \lambda_1 < \lambda_B$, $\lambda_{02} < \lambda_2 < \lambda_{01}$, $\lambda_A < \lambda_3 < \lambda_2$) are incident upon the heterojunction photodiodes, the electrical output signals appearing at the terminal 3 in FIG. 4*a* indicate the light signals corresponding to the wavelengths $\lambda_1$, $\lambda_2$, $\lambda_3$ at zero bias voltage; $\lambda_2$, $\lambda_3$ at bias voltage $V_1$; and $\lambda_3$ at bias voltage $V_2$. Therefore, by sampling these electrical signals over a period of time and detecting the differences between these electrical signals, the multi-wave length light signals can be converted into separate electrical signals. The example described above will show that one phototransducer can detect multi-channel light signals comprising different wavelengths. The number of channels of such light signals is not limited to two or three, as described in the above example.

The phototransducers according to the invention can be easily made in the form of integrated circuits by using conventional techniques for integration that have been developed for microelectronic devices. Therefore, the phototransducers of the invention are very useful for making integrated optoelectronic devices.

What is claimed is:

1. A tunable phototransducer, comprising:

a heterojunction photodiode constituted by two layers of semiconductor material of the same type (p or n), one which has a small bandgap energy and is a base material, and the other of which has a large bandgap energy and is positioned on said base as a window material, said heterojunction photodiode generating a first voltage of one polarity in response to an incident light in a lower wavelength range of the photoresponse range thereof and also generating a second voltage of the opposite polarity in response to an incident light in an upper wavelength range of the photoresponse range thereof, wherein the generated first and second voltages have magnitudes in accordance with the relative intensities of the incident light;

a first metal electrode provided on said window material a first high impedance variable bias source connected at one terminal thereof to said first metal electrode and at a base terminal thereof to said base material;

a first rectifier connected at a first terminal thereof to said one terminal of said first variable bias source, a second terminal of said first rectifier comprising a first output terminal of said phototransducer;

a second metal electrode provided on said window material and spaced apart from said first metal electrode, the area of said window material between said first metal electrode and said second metal electrode comprising means for receiving incident light;

a second high impedance variable bias source connected at one terminal thereof to said second metal electrode and at at base terminal thereof to said base material, said second variable bias source providing a bias voltage the same as that of said first variable bias source;

and a second rectifier connected at a first terminal thereof to said one terminal of said second variable bias source, a second terminal of said second rectifier comprising a second output terminal of said phototransducer, the rectifying property of said second rectifier as seen from said second output terminal being opposite to that of said first rectifier as seen from said first output terminal, whereby the output voltage between said first output terminal and said base material shows the existence and relative intensity of the incident light in the lower range of said photoresponse range, and the output voltage between said second output terminal and said base material shows the existence and relative intensity of the incident light in the upper range of said photoresponse range.

2. A tunable phototransducer as claimed in claim 1, wherein each of said first variable bias source and said second variable bias source comprises a low impedance voltage source and a high impedance series resistance.

3. A tunable phototransducer as claimed in claim 1, wherein each of said first variable bias source and said second variable bias source comprises a sawtooth wave voltage generator.

* * * * *